(12) United States Patent
Johansson

(10) Patent No.: US 6,437,485 B1
(45) Date of Patent: Aug. 20, 2002

(54) DOUBLE BIMORPH ELECTROMECHANICAL ELEMENT

(75) Inventor: Stefan Johansson, Uppsala (SE)

(73) Assignee: Piezomotor Uppsala AB, Uppsala (SE)

( * ) Notice: Subject to any disclaimer, the term of this patent is extended or adjusted under 35 U.S.C. 154(b) by 0 days.

(21) Appl. No.: 09/739,906

(22) Filed: Dec. 20, 2000

(51) Int. Cl.⁷ .............................................. H01L 41/08
(52) U.S. Cl. ...................................... 310/332; 310/328
(58) Field of Search ................................. 310/330, 331, 310/332, 328, 366

(56) References Cited

U.S. PATENT DOCUMENTS

| | | | | |
|---|---|---|---|---|
| 4,093,883 A | * | 6/1978 | Yamamoto | 310/332 X |
| 4,291,958 A | | 9/1981 | Frank et al. | |
| 4,295,172 A | * | 10/1981 | Fukada et al. | 310/332 X |
| 4,339,682 A | | 7/1982 | Toda et al. | |
| 5,049,775 A | * | 9/1991 | Smits | 310/328 |
| 5,089,740 A | * | 2/1992 | Ono | 310/328 |
| 5,101,278 A | * | 3/1992 | Itsumi et al. | 310/332 X |
| 5,170,089 A | * | 12/1992 | Fulton | 310/328 |

FOREIGN PATENT DOCUMENTS

| | | | | |
|---|---|---|---|---|
| DE | 0143682 | * | 9/1980 | 310/332 |
| EP | 0993055 A2 | | 4/2000 | |
| FR | 660718 | * | 3/1965 | 310/332 |
| JP | 0177979 | * | 10/1984 | 310/332 |
| JP | 61177178 | | 8/1986 | |
| JP | 2142365 | | 5/1990 | |
| JP | 404058769 | * | 2/1992 | 310/332 |
| SE | 510153 | | 4/1999 | |

\* cited by examiner

*Primary Examiner*—Mike Budd
(74) *Attorney, Agent, or Firm*—Young & Thompson

(57) ABSTRACT

The present invention discloses motors using electromechanical, preferably piezoelectric, elements (30). The element (30) comprises at least two movable parts or displacement portions (32A, 32B) interconnected by a passive part (31). Each displacement section (32A, 32B) comprises at least one bimorph (33A, 33B), where the active volumes extend in parallel out from the passive part (31), and so are the electrodes (12) arranged between the electromechanical layers. The displacement portions (32A, 32B) are positioned in substantially the same plane and parallel to the body (20) to be moved. Contact portions are arranged at the central passive part (31) and at the displacement portions (32A, 32B). In one embodiment, the central contact portion is an actuating surface (34C) and the other are attaching portions (36A, 36B) for attachment to a stator (24). In another embodiment, the central contact portion is an attaching portion and the other are actuating surfaces. The actuating surfaces (34C) are in both cases movable relative to the attaching portions (36A, 36B) in two dimensions.

22 Claims, 7 Drawing Sheets

DOUBLE BIMORPH ELECTROMECHANICAL ELEMENT

TECHNICAL FIELD

The present invention relates generally to devices and driving methods for miniature motors and in particular to electromechanical motors based on repetitions of small steps.

BACKGROUND

There are numerous applications with the need for extremely miniaturised motors that are able to make controlled fine positioning. Among these, portable consumer devices, such as e.g. cameras, have additional demands for low power consumption, low weight and price. The required motion is typically linear but often a rotating motor combined with a motion-converting mechanism such as a leadscrew is used. The motion range is often in the order of millimeters. There is yet no real miniature motors presented which fulfils all demands above.

Generally, the use of a solid actuator material and some type of magnification mechanism appear to be the best solution for the desired miniature motors. A solid actuator such as a PZT element has a very high energy density and the size of a motor could therefore be minimised. Typically, existing actuator materials with high energy density are not able to change its shape more than a tenth of a percent, which makes it difficult to make an optimised construction with small external dimensions. One component that has been used in numerous applications is a piezoelectric bimorph element since a high internal motion magnification can be achieved in the bending mode. In U.S. Pat. No. 4,291,958, a bimorph cantilever in combination with a magnifying lever is suggested for the focusing of cameras. However, the necessary stroke of such a focusing device results in a poor stiffness of the device. In U.S. Pat. No. 4,339,682, a motor based on two bimorphs connected by an elastic member to drive a rotor has been presented. Stepwise movements magnify the motion. Apart from the space demands of this construction, the conversion of a rotating motion into a linear motion does normally result in a reduced performance. Bimorphs operating in the bending mode in combination with teeth on both rotor and drive elements or only on the rotor have been used to construct mechanical stepping motors, as disclosed e.g. in the abstracts of JP 61-177178 and JP 2-142365. A method to improve the energy transfer from a bending bimorph is suggested in EP 0993055. This improved bimorph is intended to be used in an ultrasonic motor. A motor intended for applications, which demand extremely small sizes, was constructed and presented in SE9300305-1. Rotation or linear translation is performed by stepwise motion with bimorph elements in direct contact with the object to be moved. In this invention, the bimorph elements are driven in such a way that the contact point of the bimorph element moves in two dimensions, i.e. the bimorph is used both in the bending and the longitudinal direction.

In several applications, space is a crucial factor, and there is in many cases not enough space to supply enough rigid supports for two-dimensional cantilever bimorphs according to prior art. There is thus a need for simple drive elements that can operate in narrow spaces with limited mechanical support.

There are basically two properties of the support to consider. Firstly the bending deflection of the bimorph tip due to the flexibility in the support. Secondly the bending stiffness of the support in relation to the equivalent mass with respect to support bending. If the flexibility of the support would allow the bimorph tip to move as much as what is achieved by piezoelectric activation of the bimorph, then there are only a few ways to create stepwise motion. Either a stick-slip mechanism could be used or an inertial mechanism where the support bending equivalent mass is utilised, which means operation at frequencies higher than the resonance frequency of the support. The resonance frequency of the support will typically be close to the resonance frequency of the bimorph itself since the spring constants and masses have to be about the same. In practice the design will be extremely critical and at miniature size the performance rather poor. If a stiffer support is used, the resonance frequency of the support will further increase and the available operating frequency range will decrease or even disappear. There is essentially just one solution that gives freedom in design and allows for performance optimisation and that is a very high bending stiffness of the support in relation to the stiffness of the bimorph itself. To get this desired stiffness the support will be rather large or complex.

SUMMARY

An object of the present invention is to provide electromechanical elements, e.g. piezoelectric elements, which are able to operate satisfactorily with limited mechanical support and which are operable in limited radial spaces. A further object is to provide electromechanical elements with an improved efficiency and a higher ratio between force and volume. Another object of the present invention is to provide electromechanical elements having more flexible driving modes.

The above objects are achieved by devices according to the enclosed patent claims. In general words, electromechanical, preferably piezoelectric, elements are used, which comprises at least two movable parts or displacement portions interconnected by a passive part. Each displacement section comprises at least one bimorph, where the active volumes extend in parallel out from the passive part, and so are the electrodes arranged between the electromechanical layers. The displacement portions are positioned in substantially the same plane and parallel to the surface to be moved. Contact portions are arranged at the central passive part and at the displacement portions. In one embodiment, the central contact portion is an actuating surface and the other are attaching portions for attachment to a stator. In another embodiment, the central contact portion is an attaching portion and the other are actuating surfaces. The actuating surfaces are in both cases movable relative to the attaching portions in two dimensions.

Advantages with the present invention are that the motor can be manufactured very small, and with simple attachment solutions. The elements can easily be operated with dynamic as well as non-dynamic drive mechanisms, and a very high efficiency is possible to reach. Multi-axial motion can be made by the generic types of elements with which it is possible to either increase performance or reduce the number of voltage signals.

BRIEF DESCRIPTION OF THE DRAWINGS

The invention, together with further objects and advantages thereof, may best be understood by making reference to the following description taken together with the accompanying drawings, in which:

FIG. 2b is a more detailed sketch of a typical bimorph section to be used in the piezoelectric element of FIG. 2a;

DETAILED DESCRIPTION

An important application for miniaturised motors is optical lens systems, where e.g. lenses should be allowed to move linearly along the optical axis. In certain cases, it is requested to utilise a rotating motion that is converted into a linear one via threads in order to achieve larger holding forces, in particular in the direction of the optical axis. In other cases a direct linear motion is to prefer. Other applications for miniaturised motors may concern positioning of small details e.g. by tubular so-called vacuum tweezers, and in this case it is desirable to accomplish both a rotating and linear motion in the same motor.

In order to design a rotating, linear or combined linear-rotating motor being able to displace for instance a tube, but at the same time restrict the outer dimensions of the motor, it is desirable to use driving elements having small dimensions in the radial direction. The elements may instead have a larger extension in the axial direction. Bimorph elements have generally such geometry and the bending mode can advantageously be utilised for the radial motion, while the elongational mode creates a displacement in the axial direction. It is important to have a sufficiently large movement in the radial direction in order to compensate for possible shape errors of the outer surface of the tube.

Piezoelectric bimorph elements have a large advantage, which is that one can obtain a very large bending motion in relation to the shape alternations of the bulk material. An earlier invention, described in the Swedish patent SE9300305-1, has presented the design of a motor based on bimorph elements. In short, the possibility to obtain a motion of the tip of the element in two directions, both bending and elongation, is utilised in order to grip and move a rotor. By utilising two sets of elements, one set of elements can release and return to the original position while the other set holds and drives the rotor. The rotor is in such a manner moved around stepwise by using frictional forces between the tip of the element and the rotor.

Although the examples in the present invention are described utilising piezoelectric materials, e.g. soft and hard PZT, other electromechanical materials could also be utilised.

Figure 1:
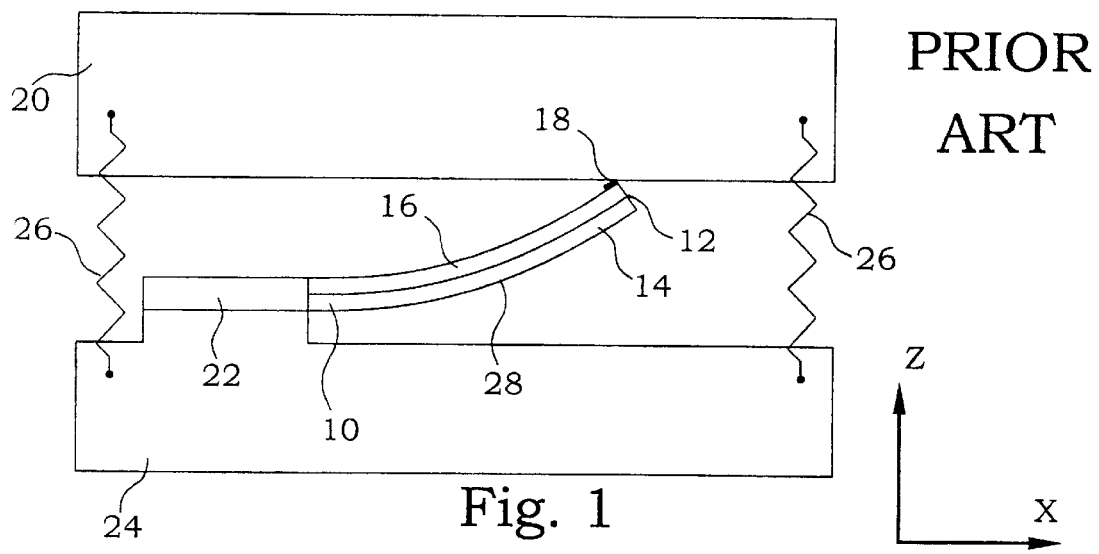
FIG. 1 is a simple sketch of a single bimorph piezoelectric element actuating on a body.

FIG. 1 illustrates a single bimorph piezoelectric element 10 according to prior art actuating on a body 20. The element 10 comprises a passive part 22 for attachment of the element 10 to a stator portion 24. The element 10 further comprises a displacement portion 28 in turn comprising at least two parallel active volumes 14, 16. Each of the active volumes 14, 16 comprises at least one piezoelectric layer. The active volumes 14, 16 can be activated individually by electrodes 12 (only one is illustrated in the figure) arranged in parallel with the active volumes 14, 16. At the tip of the displacement portion 28 is an actuating surface 18, which is brought into contact with the body 20 during operation. A resilient means 26 applies a force between the stator 24 and the body 20.

This piezoelectric element 10 has two contact portions with the surrounding parts, one attachment portion 22 and one actuating surface 18. One of the contact points is thus fixed in relation to the stator part 24, while the other is movable in relation to the body 20.

By applying a voltage between selected electrodes, the active volumes of piezoelectric layers can be activated individually. Here, it is assumed that the piezoelectric material is soft, i.e. that the material is easily re-polarised. By applying a voltage over the active volume 16, the piezoelectric layers expand in the electric field direction, i.e. each layer becomes thicker. However, at the same time, the active volume 16 will contract in the longitudinal direction. This contraction is thus related to the $d_{13}$ coefficient, discussed above. If the active volume 14 is unaltered, the decreased length of the active volume 16 will cause the displacement portion 28 of the element 10 to bend upwards in the figure, i.e. in the z direction. Note that all motions of the piezoelectric element are strongly exaggerated in the figures, in order to illustrate the motion principles.

By applying the same voltage on both volumes 14, 16, the displacement portion 28 of the element 10 can be caused to contract in the longitudinal direction, i.e. in the x direction. By combining different voltages on the respective volumes 14, 16, the actuating surface 18 can be moved in a two-dimensional space, an x-z-space, as defined by the arrows in FIG. 1. In order to move the body 20, the element 10 is forced to bend against it, as is shown in the figure, then an expansion of the element 10 is performed, which will move the actuating surface 18 basically in the x-direction (since the apparent bending is exaggerated in the figure). By then letting the element 10 regain its original straight shape or even bend away from the body, the contact with the body 20 will cease, and the element 10 can again by contracted, without bringing the body 20 back. This is a simple example of a possible driving mode for such a piezoelectric element 10.

A piezoelectric element made of a hard piezoelectric material might have a different response on the applied voltages. However, by selecting the voltages properly, the same motion pattern is possible to obtain.

A motor based on one or several such single elements has, however, some minor disadvantages, as was described in the background section. The large passive part is e.g. necessary to insure a satisfactory operation of the motor.

Figure 2A:
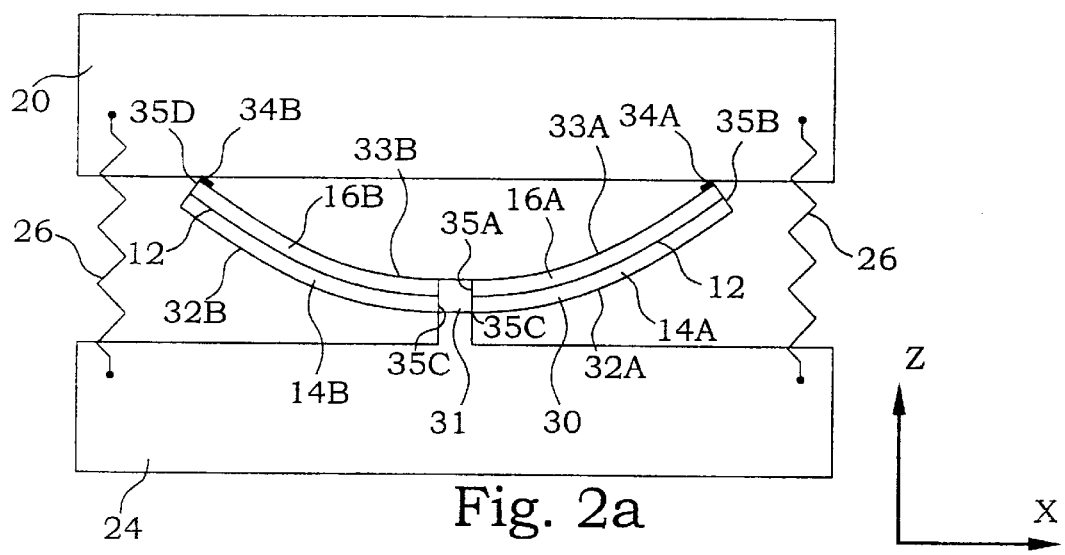
FIG. 2a is a simple sketch of an embodiment of a double bimorph piezoelectric element according to the present invention, having two actuating surfaces.

FIG. 2a illustrates a monolithic embodiment of a double bimorph piezoelectric element 30 according to the present invention. Corresponding parts as in FIG. 1 have the same reference numbers and will not be described once more. A piezoelectric element 30 comprises a first displacement portion 32A, having a first bimorph section 33A. The first bimorph section 33A has at least a first 14A and a second 16A active volume. Each of the active volumes 14A, 16A comprises at least one piezoelectric layer. The bimorph sections are generally flat, having an extension in one or two dimensions. The first bimorph section 33A is in this embodiment shaped as a beam and the active volumes 14A, 16A extend between a first edge 35A and a second edge 35B. A typical shape of a bimorph section is a beam or cantilever, where the edges 35A, 35B are the short edges of the beam and the active volumes 14A, 14B extend along the longitudinal direction of the beam. A disc sector shape is also possible, and the edges 35A, 35B are then portions of the disc sector rim. The active volumes 14A, 14B then extend in parallel with the disc surface. Electrodes 12 (only one illustrated) are arranged in parallel and within the active volumes 14A, 16A in order to activate each volume of the bimorph individually.

The active volumes 14A, 16A of the bimorph section 33A are typically built by several co-acting piezoelectric layers. By "bimorph" is normally intended a disc or beam with different properties on each side of a centre line. When concerning piezoelectric bimorphs, one may e.g. select different polarising of the piezoelectric material on each side of the centre line or a centre electrode that results in that the different sides in the disc or beam can be activated separately. The bimorph thus comprises two separate active volumes. One often uses a bimorph beam, but the bimorph can also have other shapes, for example circular discs, as discussed further below. The active volumes of each side of the centre line can in turn consist of a large number of layers with piezoelectric material separated by intermediate electrical layers. Typically, every second electrical layer is a ground layer and the other electrical layers are connected to an electrode. In this way a reduction in driving voltage can be obtained for a certain required electrical field in the piezoelectric material. The centre electrode is often a ground electrode, since it is common to both phases. In the following description, only the centre electrode and sometimes one phase electrode in each active volume are drawn in order to simplify the sketches.

Figure 2B:
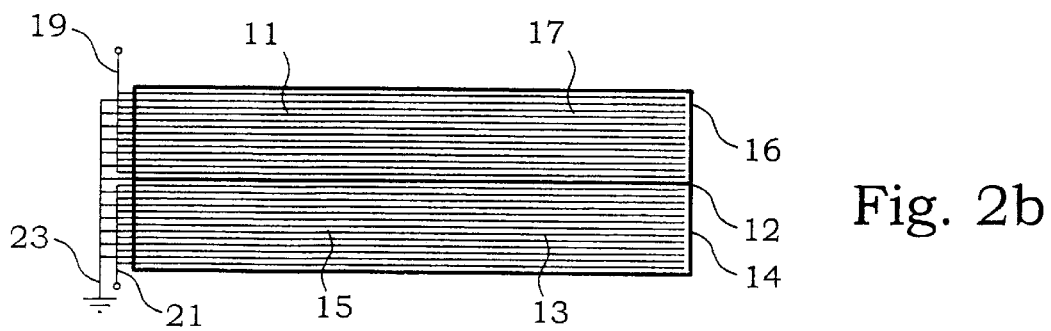

In FIG. 2b, a typical bimorph multilayer section is illustrated in more detail. The bimorph comprises two active volumes 14, 16, separated by a ground electrode 12. The upper active volume 16 comprises a number of piezoelectric layers 17, separated by electrodes 11. Similarly, the lower active volume 14 comprises a number of piezoelectric layers 15, separated by electrodes 13. Every second electrode of the upper active volume 16 is connected to a first phase electrode 19 and every second electrode of the lower active volume 14 is connected to a second phase electrode 21. The rest of the electrodes are connected to a ground electrode 23.

The piezoelectric effect that is utilised in a conventional bimorph is the contraction (given by the coefficient $d_{13}$) perpendicular to the electrical field. The $d_{13}$ mode gives a smaller strain than the $d_{33}$ mode (expansion parallel to the field), but for small multilayer elements this is normally compensated since a larger volume of the element can be utilised.

The piezoelectric element 30 in FIG. 2a also comprises a second displacement portion 32B having a second bimorph section 33B. The second bimorph section 33B has at least a third 14B and a fourth 16B active volume. Each of the active volumes 14B, 16B comprises at least one piezoelectric layer. The second bimorph section 33B is in this embodiment shaped as a beam and the active volumes 14B, 16B extend between a third edge 35C and a fourth edge 35D. Electrodes 12 (only one is shown) are arranged in parallel and within the active volumes 14B, 16B in order to activate each volume of the bimorph individually. As discussed above, the active volumes 14B, 16B of the bimorph section 33B are typically built by several co-acting piezoelectric layers.

The first and the second displacement portions 32A, 32B are monolithically interconnected by a passive portion 31 by the first edge 35A and the third edge 35C, respectively. The first, bimorph section 33A is in other words abutted with its first edge 35A to the third edge 35C of the second bimorph section 33B via the passive portion 31. In other words, the piezoelectric element 30 of this embodiment comprises a centre section of passive material 31, from which two beams 32A, 32B extend. The two displacement portions 32A, 32B are positioned substantially in the same plane. The bending of the displacement portions 32A, 32B takes place essentially perpendicular to this plane and essentially perpendicular to the surface of the body 20 to be moved.

In FIG. 2a, each tip of the beams 32A, 32B is supplied with a respective actuating surface 34A and 34B, which acts on the body to be moved 20. The passive part 31 constitutes instead an attachment portion to the stator 24. The piezoelectric element 30 of this embodiment has thus three contact portions, one at the centre, at the passive portion 31 and two at a distance from the passive portion 31 and the edges 35A, 35C connected thereto. Preferably, these outer contact portions are situated adjacent to the tip of respective beam, i.e. close to the outer edges 35B and 35D, respectively. The centre contact portion is in this embodiment an attachment portion 31, and the outer contact portions are actuating surfaces 34A, 34B.

The piezoelectric bimorph element 30 of FIG. 2a can be operated in several different modes. Preferably, the two actuating surfaces 34A, 34B are driven in parallel, i.e. both actuating surfaces 34A, 34B are in contact with the body 20 at the same time, driving the body 20 in the same direction, and releasing the body 20 at the same time. The element 30 of FIG. 2a gives certain advantages compared with the use of a single beam element. Since the contact to the body 20 is made by two actuating surfaces 34A, 34B, the stability of the body 20 against rotation is improved considerably. Furthermore, if the two actuating surfaces 34A, 34B are driven in-phase with each other, most bending forces applied to the attachment portion 31 is compensated by the opposite beam. The passive portion 31 can thus be made considerably smaller than the passive portion 22 (FIG. 1) of a single-beam element. The utilisation of the piezoelectric material and the space around the body 20 is thus much more efficient.

In certain applications, it might be of interest to drive the actuating surfaces 34A, 34B out-of-phase, which implies that a stronger attachment of the element 30 has to be supplied.

In practise, it will be difficult to manufacture all components with such tolerances that all components have the necessary micrometer accuracy. It is then better with a construction that compensates for all manufacturing and mounting tolerances. An advantage with the element of FIG. 2a is that both the attachment point and any implementation of the spring means 26 can be simplified, if the attachment is selected so weak that the element adjusts itself with both actuating surfaces against the tube. The advantage with the element of FIG. 2a is thus not only the smaller attachment area, but also that the mounting can be simplified.

Figure 3:
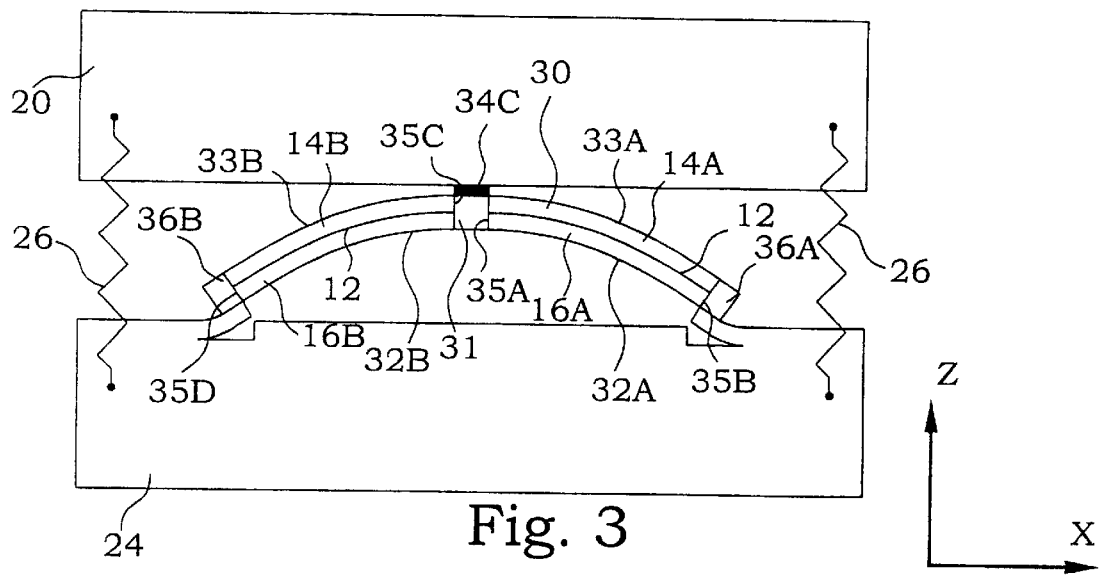
FIG. 3 is a simple sketch of another embodiment of a double bimorph piezoelectric element according to the present invention, having one actuating surface.

In FIG. 3, an alternative embodiment of a double bimorph piezoelectric element according to the present invention is illustrated. Corresponding parts as in FIG. 2 have the same reference numbers and will not be described once more. Also here, the piezoelectric element 30 comprises a first displacement portion 32A and a second displacement portion 32B. The displacement portions 32A, 32B comprise bimorph sections 33A, 33B of active volumes 14A, 14B, 16A, 16B including piezoelectric layers as described above and are interconnected by a passive portion 31. The two displacement portions 32A, 32B are positioned substantially in the same plane.

In FIG. 3, each tip of the beams 32A, 32B is supplied with a respective attachment portion 36A and 36B, which holds respective beam tip fixed to the stator 24. These attachment portions 36A, 36B are preferably passive portions of respective displacement portion 32A, 32B. The passive part 31 in the centre is in this embodiment instead provided with an actuating surface 34C for contacting the body 20. The piezoelectric element 30 of this embodiment has thus also three contact portions, one at the centre, at the passive portion 31 and two at a distance from the passive part 31 and the edges 35A, 35C connected thereto. Preferably, these outer contact portions are situated adjacent to the tip of respective beam, i.e. close to the outer edges 35B, 35D. The centre contact portion is in this embodiment an actuating surface 34C, and the outer contact portions are attachment portions 36A, 36B.

The piezoelectric bimorph element of FIG. 3 can be operated in several different modes. The two beams are preferably driven in co-operation with each other, since they drive one common actuating surface 34C. When one beam contracts, the other typically expand, and they should preferably bend the same amount at all instances. Between the attachment portions and the actuating surface, there are four independent active volumes, 14A, 14B, 16A and 16B. The four active volumes admit motions of the actuating surface in both the z and the x direction. For a soft piezoelectric material a positive z motion is achieved when the volumes 14A and 14B are activated at the same time, and a negative z motion when the volumes 16A and 16B are activated simultaneously. If, however, the volumes 14A and 16A are activated simultaneously, a positive x motion will arise, and a simultaneous activation of the volumes 14B and 16B gives a negative x motion. Here, it is assumed that the attachment points 36A, 36B and the stator counterparts to which they are attached are inelastic or have a similar flexibility. The properties of the attachment are important in order to have best possible behaviour and will be explained later.

Driving modes comprising rotation of the common actuating surface 34C can also be achieved, by active volumes diagonally, i.e. for instance 14A and 16B. An actual actuating surface has a non-negligible area. By utilising a large area, a tilting of the actuating surface can be achieved.

The element of FIG. 3 gives certain advantages compared with the use of a single beam element. The support do not need to be stable against bending torque, but rather the opposite, since a reduced bending stiffness gives a larger stroke in the z direction. The construction of an inertial motor is greatly simplified as the inertia of the whole stator part 24 is typically much larger than the bimorph and support. This gives a larger operating frequency range. Using hard PZT, a buckling mode can also be superimposed by expansion of the element in the x-direction, which results in higher deflections and forces than conventional bimorph bending.

The drive elements are preferably monolithic, manufactured by multilayer techniques using piezoelectric material. However, also other types of drive elements and materials are possible to use in the present invention.

Electromechanical motors and actuators, and in particular piezoelectric motors and actuators, are available in a huge number of varieties. One way to classify the devices is to divide them according to their driving mechanism. The features and problems of the devices are often specific for each group or sub-group. One solution applied to a motor device of a particular driving mechanism may be totally irrelevant for other types. In the present invention, electromechanical devices having non-dynamic, pseudo-static or inertial driving mechanisms are considered. For a better understanding of the common driving mechanisms, a brief report on different mechanisms is given in appendix 1.

Figure 4A:
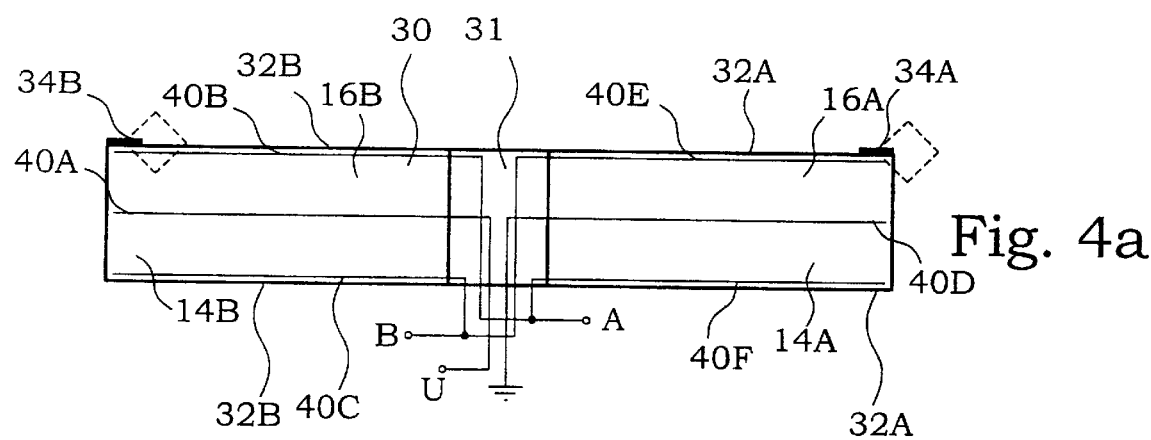
FIG. 4a is a schematic drawing of a circuit for driving a double bimorph piezoelectric element of soft piezoelectric material according to FIG. 2 or 3 with two voltage pulses.

Having an element as in FIG. 2 or 3, it will in a general case be controlled by four controllable phases and ground. In FIG. 4a, a solution of reducing the number of controllable phases for a soft piezoelectric element of the type of FIG. 2 is shown making it possible to create a stepping motion. A double bimorph piezoelectric element 30 has two displacement portions 32A and 32B. The electrodes are for the sake of simplicity illustrated as single electrodes, even if the different phases in a practical case will comprise several electrodes each. The centre electrodes have reference numbers 40A and 40D, respectively, and the four controllable phases have the reference numbers 40B, 40C, 40E and 40F, respectively. One of the centre electrodes 40A is supplied with a constant voltage U, corresponding to the highest voltage U of the phase electrodes, the other centre electrode 40D is connected to ground. The upper electrode 40B of one element portion is connected to the lower electrode 40F of the other element portion, and vice versa. These electrode sets are then controlled by two phase-shifted voltage signals A and B.

Figure 4B:
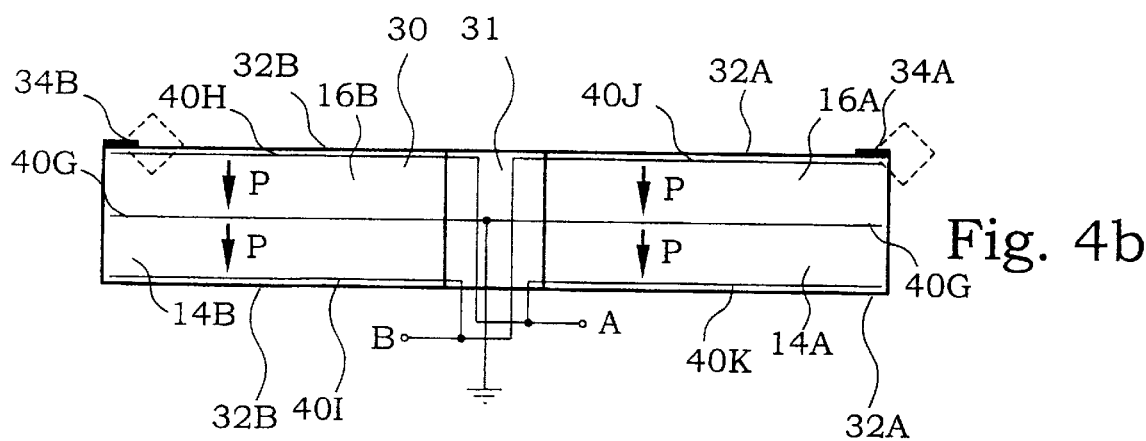
FIG. 4b is a schematic drawing of a circuit for driving a double bimorph piezoelectric element of hard, pre-polarised piezoelectric material according to FIG. 2 or 3 with two voltage pulses.

For hard piezoelectric materials, both bimorphs can have the same central voltage, typically ground, but the polarisation is chosen to get the desired behaviour. This is illustrated in FIG. 4b by the electrodes 40G–K. The polarisation direction is indicated by the arrows P.

Figure 5:
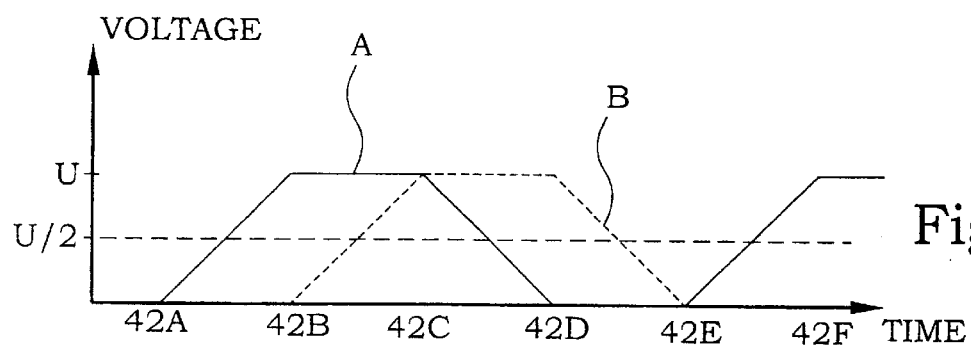
FIG. 5 is a diagram illustrated a useful voltage pulse shape for the circuit in FIG. 4.

FIG. 5 illustrates one possible shape of the voltage signals to be used in a system of FIG. 4. A first phase voltage A has a linear increase up to the maximum voltage U. The maximum voltage U is kept for a while and is then decreasing linearly to ground potential again. A second phase voltage B has the same general shape, but is phase shifted relative to A. In this example, a soft piezoelectric material has been selected and then, the voltage is normally not reversed. For a hard piezoelectric material, the voltage can be reversed and one may create corresponding movements by placing the ground potential half way between the maximum and minimum voltages of the phases. By applying these voltage phases to the electrodes of FIG. 4, the actuating surfaces 34A, 34B of the element will describe a rhombic motion path.

The description of the function will be simplified in that the shape alteration is assumed to be linear with applied voltage. Depending on the choice of material, the real shape alteration will differ from linear, but the error will not be so large that the main features will change. With reference to FIG. 5, at the point 42A both phase A and B are zero and the actuating surface 34B is in a zero position, and the actuating surface 34A is in a maximum contracted state. From 42A, phase A increases linearly up to maximum voltage at point 42B, which means that both actuating surfaces 34A and 34B moves upwards and to the right in FIG. 4. From the point 42B to 42C, the voltage of phase B increases to its maximum value and the actuating surface 34A, 34B will move downwards and to the right. The actuating surface 34B is now in a maximum contracted state, while the actuating surface 34A is in a "zero" position. The phase voltages of A and B will decrease in the same phase-shifted manner, which will result in a motion back to the original positions for the actuating surfaces 34A, 34B. Both actuating surfaces 34A, 34B will move synchronously according to the broken line paths in FIG. 4a (exaggerated) and by e.g. selecting a motion frequency that implies that the actuating surfaces move essentially free from contact between the points 42D and 42F in the example above, the body will be driven forwards by an inertial mechanism. The direction of motion will be reversed if the phase shift between the phases A and B is reversed. The speed can be controlled by the frequency within a certain interval, which is limited by the resonance frequency of the driving element and the relation between spring force and stator inertia. Driving elements in the order of millimeters can typically operate in frequency intervals of 5 to 35 kHz.

Other voltage signals can also be used. Preferably, the ramping portions of these voltage signals should be symmetric around half the maximum voltage (U/2).

A corresponding driving arrangement can be provided for an element according to FIG. 3.

Figure 6:
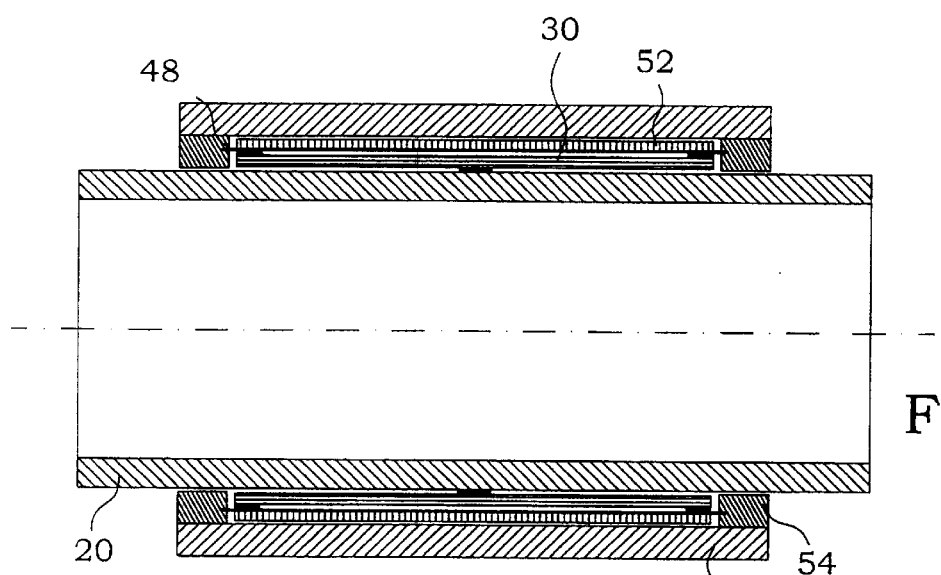
FIG. 6 is a sectional view along the axis of a piezoelectric motor according to the present invention driving a tubular body.
Figure 7:
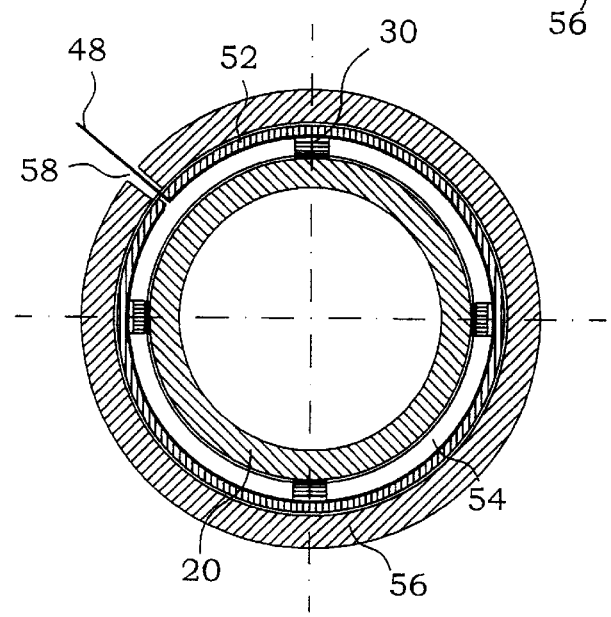
FIG. 7 is a cross-sectional view of the motor of FIG. 6.

In FIG. 6 is illustrated a sectional view along the axis of a piezoelectric motor according to the present invention, driving a tubular body 20. Two piezoelectric elements 30 are shown in the section. They are in this embodiment of the type illustrated in FIG. 3, and similar parts are provided with the same reference numbers. The elements 30 are attached to a flexible printed circuit board 48, in turn fixed by two bushings 54 of a suitable low-friction material and an outer stator tube 56. A spring 52 is arranged to apply a force on the elements 30 towards the centre of the tubes, i.e. against the body to be moved—the inner tube 20. In principle, also a flexible printed circuit board 48 can be stiffened-up by e.g. a thicker metallic film, and then act as a tubular spring. A cross-sectional view of the motor of FIG. 6 is illustrated in FIG. 7. Here, four elements 30 are visible, enabling e.g. a pseudo-static, walking or inertial driving mechanism, without extreme requirements on manufacturing and mounting precision or grinding in. It is also possible to use fewer or more elements, in some cases combined with additional spring arrangements. Motors with less than four drive elements are preferably driven with an inertial or pseudo-static driving mechanism. With three or four elements, a self-aligning and self-stabilising effect is achieved. If more elements are used in different axial positions, the bushings may also be omitted. In FIG. 7 an opening 58 in the stator tube 56 is shown, through which the flexible printed circuit board 48 can be arranged, which facilitates the arrangement of voltage connections to the different element phases.

In FIG. 6, the geometry of the element 30 in relation to the body 20 to be moved is clearly illustrated. The element has its bimorph sections in substantially the same plane and parallel to the surface of the body to be moved. In this case, the elements 30 are extended in the axial direction of the central tube 20. It is also conceivable to have elements following the tangential direction, i.e. the element will be bent, following a circular plane parallel to the circumference of the central tube 20. One such element is illustrated further below. From FIG. 6 and FIG. 7 it is easily noticed that the extension of the motor in the radial direction is very small indeed. Such a motor design is suitable for instance for optical systems, where the body to be moved is or is connected to an optical lens.

In FIG. 7, four drive elements are displaced symmetrically around the cylinder to be moved. This arrangement will, due to the self-centring of the body to be moved, make it possible to use non-dynamic as well as inertial or pseudo-static drive mechanisms.

Figure 8A:
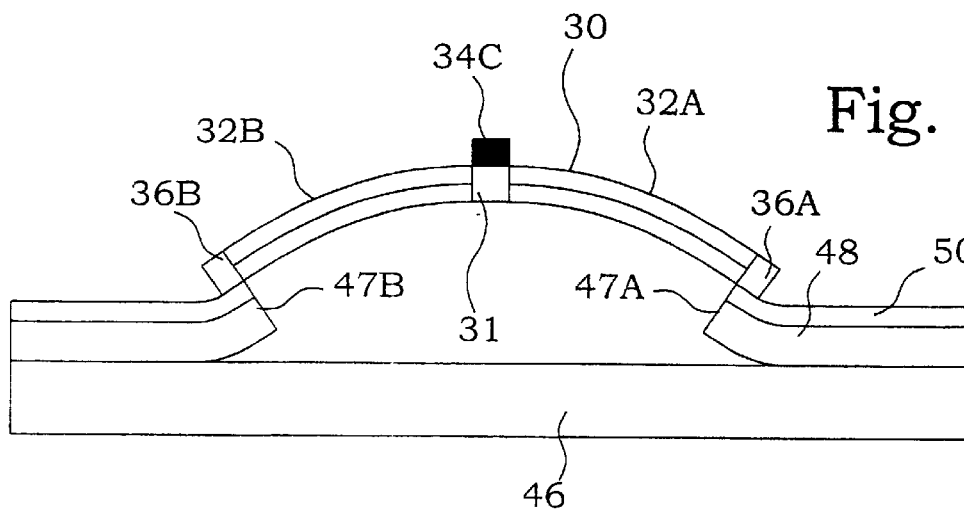
FIG. 8a is a sketch illustrating flexible attachment points of a stator in a piezoelectric motor according to the present invention.

If the attachment of the drive element to the stator is totally inflexible, the stator will counteract a large portion of the element bending. By introducing a turning flexibility in the attachment, a larger stroke will be available. FIG. 8a illustrates a possibility to improve the flexibility of the attachment. In this example, a double-beam element 30 is attached by its two attachment portions 36A and 36B, respectively, to tabs 47A, 47B of a flexible printed circuit board 48, in turn attached to the stator main portion 46. This attachment arrangement will give the attachment point a freedom to rotate, but will restrict motion in the x direction and restrict motion in the z direction somewhat. The shape and size of the tab 47A, 47B can be adjusted to give the attachment point the appropriate properties. A metal film 50 can be provided on the surface of the flexible printed circuit board 48 in order to make it even stiffer.

Figure 8B:
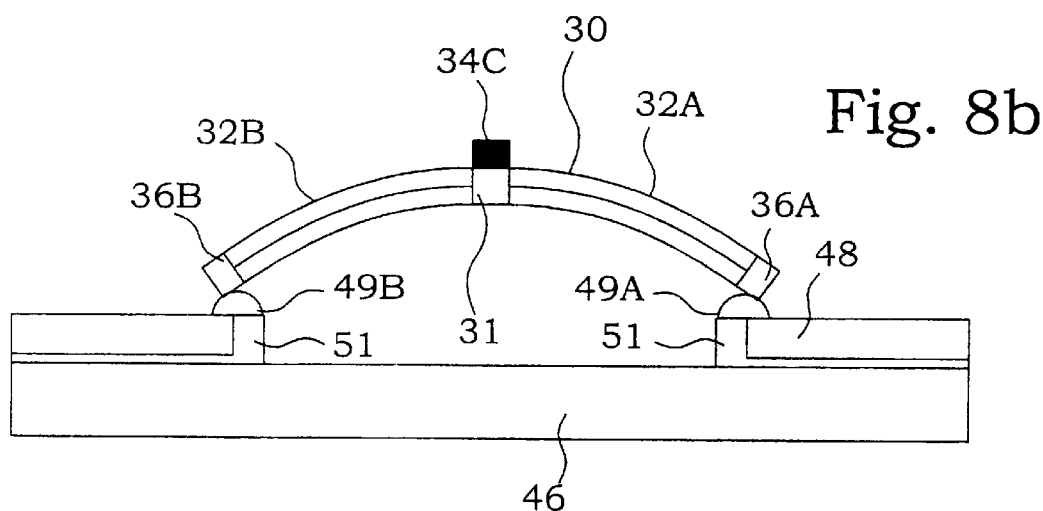
FIG. 8b is a sketch illustrating an alternative embodiment of flexible attachment points of a stator in a piezoelectric motor according to the present invention.

FIG. 8b shows an alternative solution. Using electrical vias 51 and/or solder bumps 49A, 49B, mesa-type metal structures that have a high stiffness in the x and z directions, but a fairly low bending stiffness, will be created.

Figure 9:
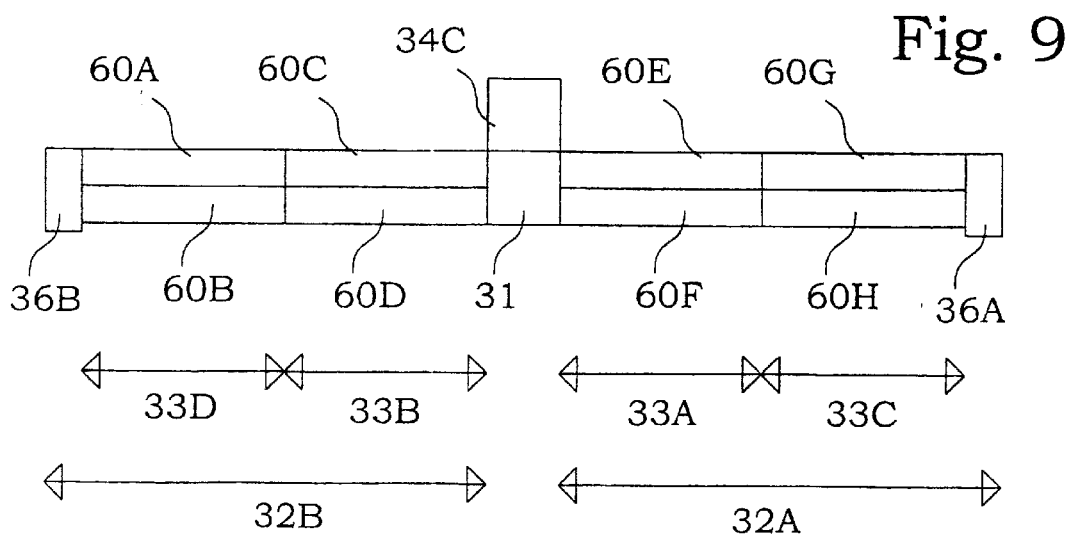
FIG. 9 is a simple sketch of an embodiment of a piezoelectric element according to the present invention having four bimorph sections.

Another way, using a stiff attachment, is illustrated in FIG. 9. Here an element 30 comprises two displacement portions 32A, 32B, which comprise two bimorph sections each, i.e. the displacement portion 32A comprises the bimorph sections 33A and 33C and the displacement portion 32B comprises the bimorph sections 33B and 33D. The bimorph sections are provided with piezoelectric layers and electrodes similar to what has been described before. The bimorph sections of one displacement portion are arranged edge to edge, forming one common beam. In other words, the element comprises two beams, each of which having serial bimorph sections abutting edge to edge. The bimorphs have eight individually controllable active volumes 60A–H, which enables the creation of new motion patterns. In the simplest case, the bimorph sections are of equal length, but may in more elaborate applications be selected to give requested properties at the attachment points.

A typical motion is created by letting the bimorph sections of each displacement portion have an opposite bending. In order to achieve a motion in the z direction, the sections 33C and 33D create a bending outwards. An opposite bending is simultaneously created by the sections 33A and 33B. The attachment points 36A, 36B may then be kept planar, independent of the z position of the actuating surface 34C. It is also possible to reduce the clamping forces to a minimum by adjusting the activation levels in all sections.

Figure 11:
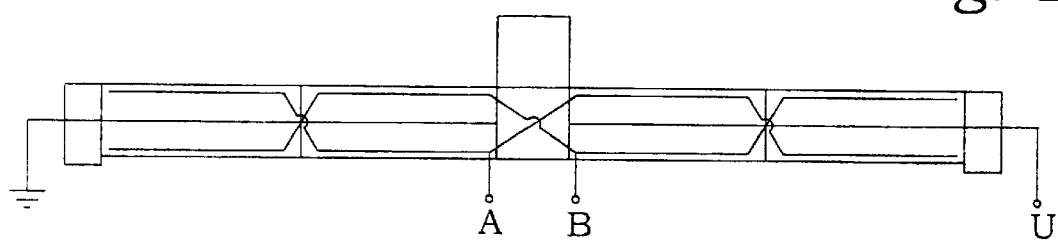
FIG. 11 is a schematic drawing of a circuit for driving a piezoelectric element according to FIG. 9 with two voltage pulses.

If a simplified driving of the element in FIG. 9 is requested, it may be connected according to FIG. 11. The two phases give in this sketch possibilities to control both x and z motion, but not any tilting around the x-axis. The connections are basically in analogy with FIG. 4.

Figure 10A:
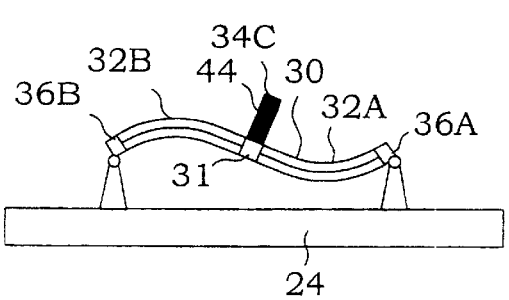
FIGS. 10a–d schematically illustrates possible motion modes of a piezoelectric element according to FIG. 9, having a motion magnifying lever.
Figure 10B:
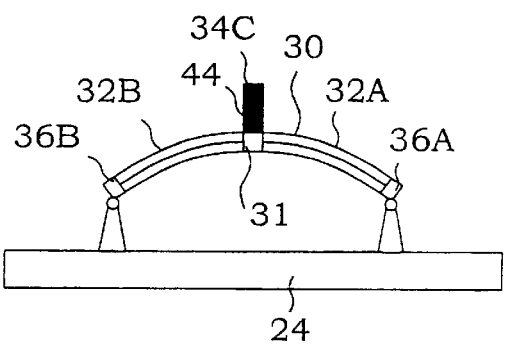
Figure 10C:
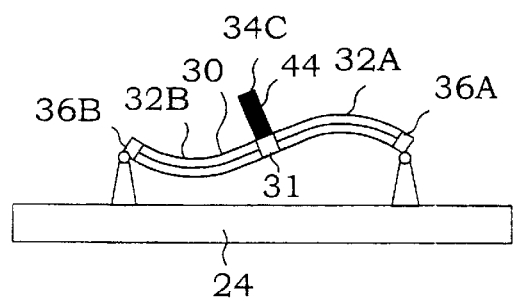
Figure 10D:
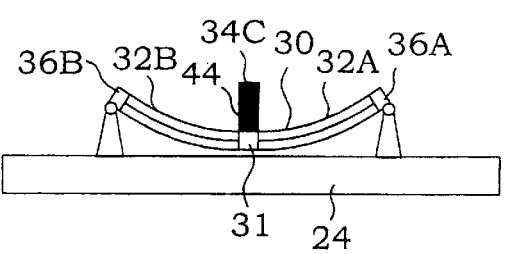
Figure 10E:
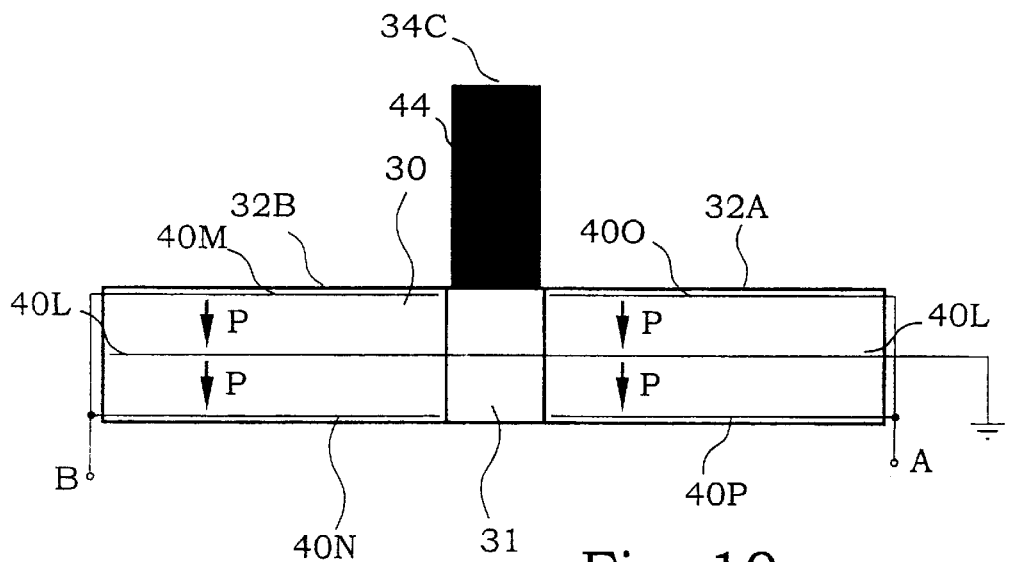
FIG. 10e is a schematic drawing of a circuit for driving a piezoelectric element of hard, pre-polarised piezoelectric material according to FIGS. 10a–d with two voltage pulses.

FIGS. 10a–d illustrates a further developed embodiment of the present invention. The element 30 is based on the element according to FIG. 3. The actuating surface 34C is now placed at the end of a magnifying lever 44 attached at the passive portion 31. By driving the two displacement portions 32A and 32B in a symmetric manner with respect to the passive portion 31, the magnifying lever 44 is moved basically in the z direction, see FIGS. 10b and 10d. By instead driving the two displacement portions 32A and 32B in an anti-symmetric manner with respect to the passive portion 31, the magnifying lever 44 is tilted, see FIGS. 10a and 10c. A tilted magnifying lever 44 will move the actuating surface 34C in the x-direction. A turning of the element can thus be transferred into a linear motion. Since the absolute strokes of the active volumes are extremely limited, such tilting of a lever 44 can increase the available stroke of an actuating surface 34C. Such a transfer is very favourable both in the view of increasing the size of the motion and by the possibility to transfer more mechanical energy, i.e. a better mechanical coupling between the driving element 30 and a driven surface. In an ideal case it is possible to transfer all the mechanical energy stored in the bimorph to the driven component. If a simplified driving is desired for elements according to FIGS. 10a–d, the electrodes 40L–P could be connected as in FIG. 10e. The same ground is used for both bimorphs and the polarisation of the material is chosen to get the different motion models.

In the FIGS. 10a to 10d, the displacement portions 32A, 32B are intended to have only one bimorph section each. In such a case, the attachment points 36A, 36B and their corresponding means at the stator side have to provide as free rotation around the y axis as possible, while keeping the x and z position fixed. Such a rotational freedom could be implemented by using the attachment solutions given in FIG. 8a and FIG. 8b. An alternative would be to use an element 30 according to FIG. 9, with more than one bimorph section in each displacement portion. The attachment to the stator can then be more or less stiff, but still the motion modes of FIGS. 10a–d can be achieved.

Figure 12:
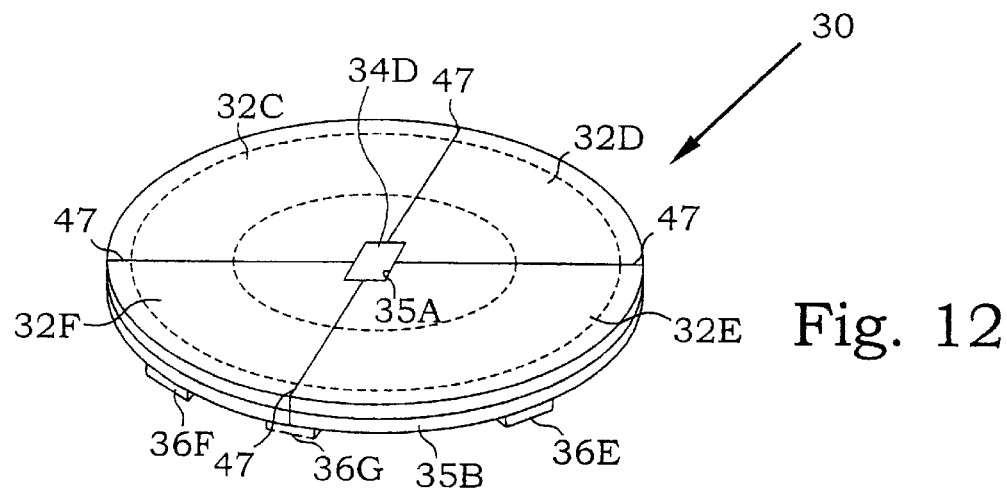
FIGS. 12–15 are schematic drawings of different embodiments of piezoelectric elements according to the present invention.

Until now, only elements of beam shapes have been discussed. It is thus possible to create bimorph elements with an extension in two planes, e.g. a circular plate, as illustrated in FIG. 12. Here a central passive portion 31 has an actuating surface 34D. Along the rim of the disc other passive portions 36C–F (only two are shown) are provided, which is used for attachment of the element 30 to the stator. In this embodiment, the disc is divided into four sectors 32C–F, which are individually activatable. It should be noticed that the placement of the passive attachment portions depends on the choice of motion modes. For bending-extension modes as in the case of the element in FIG. 3, the attachment portions are placed as in FIG. 12. For bending—bending modes, as e.g. in FIGS. 10a–d, the attachment portions are preferably placed at the sector division lines instead, such as indicated by the passive portion 36G, drawn with broken lines. The sectors 32C–F correspond to the beams or displacement portions in earlier embodiments. To each sector 32-F can be associated an attachment point 36C–F. Each sector or displacement portion comprises at least one bimorph section in analogy with earlier discussions. The operation of the bimorph sections will basically result in a buckling of the disc, moving the actuating surface 34D up and down, sidewards and tilt it. The sideward motion is to some extent limited by the solid disc geometry, and an alternative in this embodiment would be to provide the disc with a magnifying lever, as in FIG. 10, and use bending modes of the disc instead.

Figure 13:
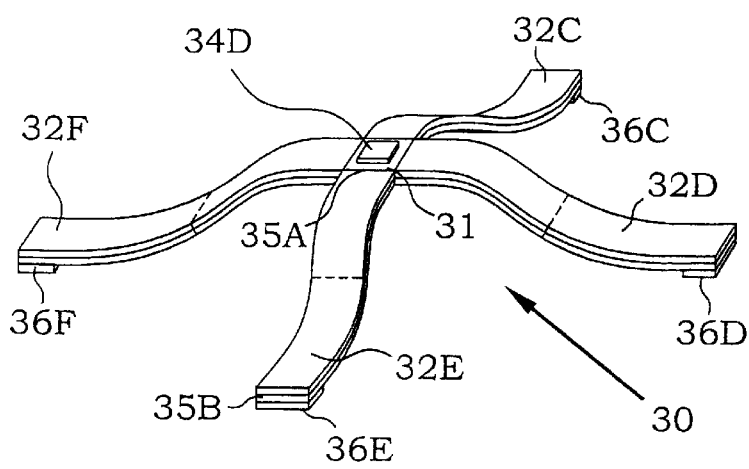

Another way to reduce the stiffness in an element according to FIG. 12 would be to introduce slits 47 between the different sectors. In FIG. 13, the slits are increased, creating basically a four-beam element with a cross geometry. This increases the flexibility and the motion in the "disc" plane will subsequently increase. Even if the illustrated embodiment has four "legs", any number of "legs" will of course be able to use.

Figure 14:
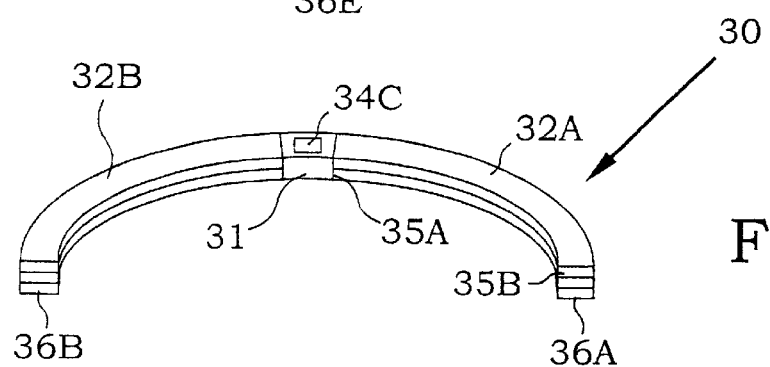
Figure 15:
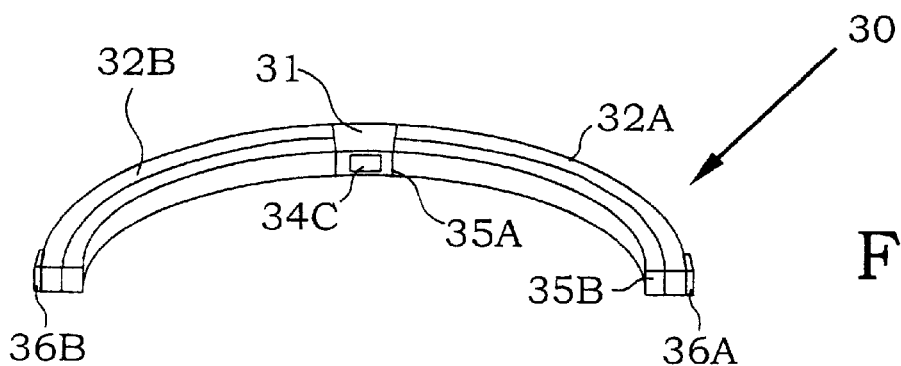

Also beam-shaped elements can be given different shapes. Two examples are illustrated in FIG. 14 and FIG. 15. In these embodiments, an arc shape is used, which may be advantageous for applications with a cylindrical or spherical geometry. In this way the individual geometry of each application can be utilised to minimise the space necessary for the actuating operation. In the element in FIG. 15, the bimorphs are positioned in one and the same cylindrical plane. Elements could also be connected in series to create rings with two or more double beams.

Figure 16:
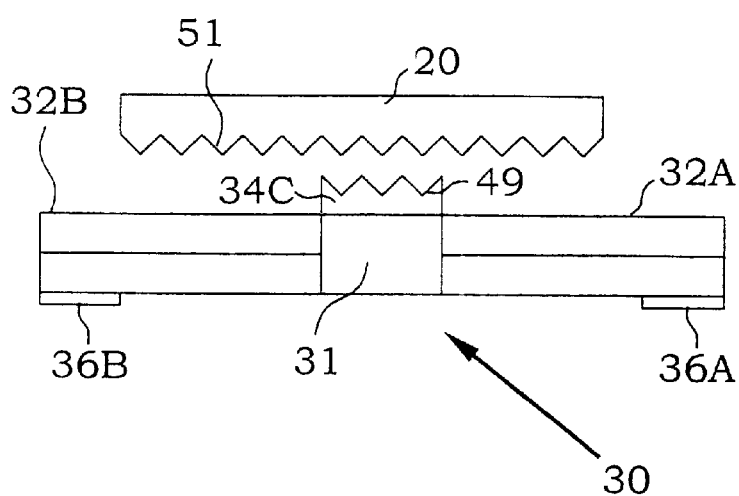
FIG. 16 illustrates the use of friction enhancing elements of an actuating surface of a piezoelectric element.

In many cases, the force created by the elements in larger than what is possible to apply to the body to be moved, if one only uses frictional forces. One solution for this is to use some friction enhancing geometries 49, 51 at the actuating surface 34C and/or the surface of the body 20 to be moved. In FIG. 16, surfaces 49, 51 with teeth are illustrated. This increases the force that can be applied between the actuating surface 34C and the body 20. It will, however, also put extra demands on the stroke in the z direction since the teeth of the surface have to release their relative engagement at the restoring phase of each step. A teeth-geometry may also contribute in positioning, since the teeth 49 of the actuating surface 34C will be centred with respect to the teeth 51 of the body 20. The steeper the teeth are, the higher force they will admit, but at the same time, the stepping has to be performed in a more careful manner. Due to technological constraints, the teeth tips will typically be flat and the positioning has to be preformed in such a way that the teeth will grip instead of ending up with the flat parts against each other.

It will be understood by those skilled in the art that various modifications and changes may be made to the present invention without departure from the scope thereof, which is defined by the appended claims.

REFERENCES

U.S. Pat. No. 4,291,958
U.S. Pat. No. 4,339,682
JP 61-177178 (abstract)
JP 2-142365 (abstract)
EP 0993055
SE9300305-1.

APPENDIX 1

Several different motors based on electromechanical materials have been proposed and some of these have been commercialised. To distinguish the various driving mechanism that has been disclosed in various articles and patent applications, the mechanisms can be divided according to physical principles and in particular regarding the importance for miniature motors. Further sub-divisions are possible. A brief description of the different mechanisms is presented below.

The first division of driving mechanisms is made between dynamic mechanisms and non-dynamic mechanisms. By using the inertia of some motor component and/or time dependent physical effects, various electromechanical motors based on dynamic mechanisms can be realized. Typically, the motors can only operate in a certain frequency range with no operation at low internal speed or frequency. The commonly encountered names ultrasonic and travelling wave motors belong to the group dynamic mechanisms where the latter is a particular example of a motor based on mechanical resonance.

The main part of motors constructions disclosed are based on mechanical resonance of either the piezoelectric material itself or a structure mechanically coupled with the piezoelectric material. The driven component is moved by intermittent cyclic contact with the resonating surface or elements. In a travelling wave motor there will always be contact between the driven component, normally a rotor, and some of the resonating elements. The major interest in this mechanism is connected to the potential for energy saving and motion magnification. An active structure in resonance can move with little consumption of energy, which theoretically could be used in a highly efficient motor. Depending on how easy it is to bring the structure in resonance, a smaller or larger motion amplification can be obtained. Motion magnification is important when the dimensions are reduced and the clearance between the mechanical parts is small. Disadvantages in practice are the relatively high wear and difficulties in approaching a large motion range of the resonating parts without failure.

Some motors use inertial effects. The driven component is moved by intermittent friction contact with the actuator element in a cyclic manner. The inertia of the driven component, or some other parts in the motor, is chosen so that the actuator elements are able to move freely, normally by fast and two-dimensional motion, to another contacting position. One cycle consists of creating dynamic contact, movement of the driven component, dynamic release and return to start position. The dynamic nature makes it necessary to keep the cycle frequency within a certain range. The inertial mechanism will become an impact mechanism if the contacting time is short in relation to the cycle time. One important advantage with this mechanism is that in applications with short lifetimes and medium forces there are moderate demands on the surface to be in contact. Due to the dynamic motion this mechanism are inferior to a non-dynamic mechanism regarding positioning and resolution.

Stick-slip mechanisms are particular inertial mechanisms where the increase in friction coefficient at zero relative velocity between actuator elements and the driven component is utilised. Two-dimensional motion of the actuator elements is not necessary in this case. Since the friction coefficient (normally) is higher at zero relative velocity, the desired motion of the driven component is made with the actuator at a force less than the slipping force. The actuator is moved back at high speed with an initial high acceleration. The acceleration of the actuator is chosen high enough to case slippage between actuator and component to be moved. The inertia of the driven component is hence utilised. The main advantage is the simple construction and the main disadvantages are the wear of the components and the uncontrolled nature of the mechanism.

In particular early constructions presented or disclosed for piezoelectric motors were based on impact mechanisms. Generally, a part of the mechanical momentum is transferred from an oscillating actuator to the moving part. An advantage is an easy construction but there are several disadvantages including problems with changing direction of motion and wear.

The non-dynamic mechanisms are characterised in that the motion can be made at arbitrarily low frequencies or speed of the active elements. The driven component is moved by actuator elements which make motion cycles consisting of sequences such as grip, move, release and return. When one element (set) is releasing, another (set of) element will grip the driven component. This means that at least two gripping elements (or groups of elements) have to be provided, configured for providing an alternating gripping—releasing function. The upper limit of the non-dynamic mechanisms is typically a cycle frequency where mechanical resonance of the actuator elements will substantially influence the movement of the elements, i.e. the quasi-static limit. Typically the non-dynamic mechanisms are advantageous where controlled positioning is desired at low to medium-high speeds. Further this mechanism allows for easy optimisation in various applications and gives the possibility to deliver high forces. The main disadvantage is the demands on the construction in order to achieve the desired mechanism. Various solutions to simplify the constructions without losses in performance are therefore of great commercial interest. The below disclosed mechanisms for non-dynamic motion are the inchworm mechanism and a mechanism utilising cilia drive elements.

In the "inchworm" mechanism, the driven component is moved by mechanical steps in a clamp-extend-clamp fashion. There has to be at least two sets of clamping elements that move out of phase. The clamping elements are connected to a central extension tube that move the driven component. In between each motion, the extension, the driven components is clamped by both sets of elements and stands still.

With use of a cilia drive elements, mechanical stepping can be made with drive elements that are only able to move one-dimensionally. Essentially two sets of elements operating out of phase are needed. One set is able to move in a direction in between the normal and tangential direction. The other set is also able to move in a direction in between the normal and tangential direction, but typically mirror imaged, with respect to the normal axis, relative the first set. If the first set is raised the driven component is moved both normally and tangentially. The second set is raised to contact the driven component and then the first set is lowered. When the second set is lowered the driven components moves in the same direction as was achieved with the first set. Change of direction is achieved by change of phase between the two sets.

It is also possible to create motion by mechanisms that are essentially non-dynamic in the contact with the body to be moved, but involves certain parts with a dynamic character. Such a mechanism can be used for controlled walking and is based on two sets of elements where the set in contact with the driven component is operating (quasi-) static and the set which is not in contact with the driven component is operating in a more dynamic manner. Typically, the elements which are not in contact with the driven component use the inertia of the element and/or other components to make a fast return from a release to the grip sequence. The driven component can hence be moved at arbitrarily low speeds but the frequency or speed of the return sequence has to be sufficiently high for the element to be able to move freely. Such a mechanism can be called pseudo-static.

What is claimed is:

1. An electromechanical motor, comprising:
   a stator part (24), a body (20) to be moved, and at least one monolithic electromechanical element (30);
   said monolithic electromechanical element (30) having a general elongated shape, extending substantially parallel to a main displacement direction (X) of said body (20);
   said monolithic electromechanical element (30) comprising a first displacement portion (32A) and a second displacement portion (32B) interconnected by a passive section (31);
   said first displacement portion (32A) and said second displacement portion (32B) in turn comprising a first bimorph section (33A) and a second bimorph section (33B), respectively;
   said first and second bimorph sections extending in an elongation direction of said monolithic electromechanical element (30) and having at least two active volumes each (14A, 14B, 16A, 16B) and electrodes (12) for activation of said active volumes (14A, 14B, 16A, 16B);
   said active volumes (14A, 14B, 16A, 16B) having at least one electromechanical layer each;
   a perpendicular to a main surface of said electromechanical layers and said electrodes, respectively, being arranged substantially perpendicular to a surface of said body, on which said monolithic electromechanical element acts;
   said passive section (31) having an actuating surface (34C);
   said first displacement portion (33A) and said second displacement portion (33B) having an attaching portion (36A, 36B) each arranged at a distance from said passive section (31); and
   said active volumes (14A, 14B, 16A, 16B) being activatable in at least two different combinations, whereby said actuating surface (34C) is movable with respect to said attaching portions (36A, 36B) in a two-dimensional space (X, Z).

2. The electromechanical motor according to claim 1, wherein each of said first and second displacement portions being separately and restorably contractable in the main displacement direction to move said actuating surface in the main displacement direction.

3. The electromechanical motor according to claim 1, wherein said attaching portions (36A, 36B) being substantially fixed to the stator (24) with respect to motion in said main displacement direction (X) of said body (20).

4. The electromechanical motor according to claim 1, wherein said electromechanical element has a general beam shape, having said attachment portions (36A, 36B) in the vicinity of both ends (35B, 35D) thereof, said actuating surface (34C) being arranged substantially in the center part of said beam.

5. The electromechanical motor according to claim 1, wherein said passive section (31) comprises a lever (44), said actuating surface (34C) being arranged at a tip of said lever (44), providing a translation of said actuating surface (34C) by a rotation of said passive section (31).

6. The electromechanical motor according to claim 1, wherein said electromechanical element has a general circular arc shape.

7. The electromechanical motor according to claim 6, wherein said electromechanical layers and said electrodes are arranged substantially parallel to a tangential plane of said circular arc shape.

8. The electromechanical motor according to claim 6, wherein said electromechanical layers and said electrodes being arranged substantially perpendicular to a tangential plane of said circular arc shape.

9. The electromechanical motor according to claim 1, wherein each of said first and second displacement portions (32A, 32B) comprises at least two bimorph sections (33A, 33C; 33B, 33D), abutted edge to edge, whereby each of said first and second displacement portions has at least four active volumes (60A–D; 60E–H).

10. The electromechanical motor according to claim 1, wherein said actuating surface comprises friction increasing geometrical structures (49).

11. The electromechanical motor according to claim 1, wherein an electrode (40D) between two said electromechanical layers in said first displacement portion (32A) is connected to ground and an electrode (40A) between two said electromechanical layers in said second displacement portion (32B) is connected to a voltage corresponding to a maximum value of an exciting voltage of said electromechanical elements (U).

12. The electromechanical motor according to claim 1, wherein said electromechanical layers comprise a hard piezoelectric material and said electromechanical layers are pre-polarized in the same direction in all said active volumes.

13. The electromechanical motor according to claim 1, wherein said electromechanical element (30) operates by repetitive small steps relative said body (20).

14. The electromechanical motor according to claim 1, wherein said stator comprises a resilient member (52) pressing said electromechanical elements towards said body (20), said resilient member (52) being a metallized flexible printed circuit board.

15. The electromechanical motor according to claim 1, wherein portions (47A, 47B) of said stator part (24) to which said electromechanical elements (30) are attached are easily tiltable.

16. The electromechanical motor according to claim 15, wherein said portions of said stator part to which said electromechanical elements are attached are tabs of a flexible material (47A, 47B).

17. The electromechanical motor according to claim 1, wherein said electromechanical elements (30) are easily tiltable relative attaching portions (49A, 49B) of said stator part (24).

18. The electromechanical motor according to claim 17, wherein said attaching portions of said electromechanical elements are attached to solder bumps (49A, 49B) on said stator part (24).

19. The electromechanical motor according to claim 18, further comprising metal vias (51) in said stator part connected to said solder bumps (49A, 49B).

20. An electromechanical motor, comprising:
    a stator with a metallized flexible circuit board;
    an electromechanical element comprising first and second bimorph sections and a passive section that is between said first and second bimorph sections, said passive element comprising an actuating surface; and
    said first bimorph section at a distal end thereof in turn comprising a first attachment portion that attaches said distal end of said first bimorph section to said stator, and said second bimorph section at a distal end thereof in turn comprising a second attachment portion that attaches said distal end of said second bimorph section to said stator, said metallized flexible circuit board pressing said electromechanical element toward a body to be moved by said motor.

21. An electromechanical motor, comprising:

a stator having a circuit board with two flexible tabs on a surface thereof;

an electromechanical element comprising first and second bimorph sections, and a passive section that is between said first and second bimorph sections, said passive element in turn comprising an actuating surface; and said first bimorph section at a distal end thereof in turn comprising a first attachment portion that attaches said distal end of said first bimorph section to one of said two tabs and said second bimorph section at a distal end thereof in turn comprising a second attachment portion that attaches said distal end of said second bimorph section to the other of said two tabs.

22. The motor of claim 21, further comprising a metal film on said tabs that is stiffer than said tabs.

* * * * *